United States Patent [19]
Kanoh et al.

[11] Patent Number: 5,989,787
[45] Date of Patent: Nov. 23, 1999

[54] ACTIVATING CATALYTIC SOLUTION FOR ELECTROLESS PLATING AND METHOD FOR ELECTROLESS PLATING

[75] Inventors: Osamu Kanoh, Omihachiman; Yasushi Yoshida, Shiga-ken; Yoshifumi Ogiso, Otsu, all of Japan

[73] Assignee: Murata Manufacturing Co., Ltd., Japan

[21] Appl. No.: 09/027,612

[22] Filed: Feb. 23, 1998

[30] Foreign Application Priority Data

Feb. 26, 1997 [JP] Japan ................................ 9-042394

[51] Int. Cl.$^6$ .............................. G03C 1/50; G03C 5/58; C23C 18/28
[52] U.S. Cl. ..................... 430/324; 430/417; 106/1.11; 427/304; 427/553; 427/98
[58] Field of Search .................. 430/270.1, 324, 430/414, 417; 106/1.11; 427/98, 304, 305, 553

[56] References Cited

U.S. PATENT DOCUMENTS

| | | | |
|---|---|---|---|
| 3,719,490 | 3/1973 | Yudelson et al. | 430/202 |
| 3,791,340 | 2/1974 | Ferrara | 430/319 |
| 3,942,983 | 3/1976 | Di Blas et al. | 430/16 |
| 5,281,447 | 1/1994 | Brady et al. | 427/555 |
| 5,405,656 | 4/1995 | Ishikawa et al. | 427/500 |
| 5,874,125 | 2/1999 | Kanoh et al. | 427/98 |

FOREIGN PATENT DOCUMENTS 61-77393  4/1986  Japan .

*Primary Examiner*—John A. McPherson
*Attorney, Agent, or Firm*—Ostrolenk, Faber, Gerb & Soffen, LLP

[57] ABSTRACT

A hydrophilic activating catalytic solution for electroless plating is a mixture of lactate, palladium and alkaline medium. The solution enables depositing palladium catalyst in a short time radiation exposure and removing unwanted photo-sensitive film more effectively by water or the like. The lactate preferably comprises copper lactate and/or zinc lactate and the palladium salt is preferably palladium chloride.

22 Claims, No Drawings

5,989,787

ACTIVATING CATALYTIC SOLUTION FOR ELECTROLESS PLATING AND METHOD FOR ELECTROLESS PLATING

BACKGROUND OF THE INVENTION

1. Field of the Invention

The present relates to an activating catalytic solution for electroless plating and a method for electroless plating using the same.

2. Description of the Related Art

Electroless plating has been often employed for forming conductive patterns on a substrate, such as alumina, dielectric ceramic, polyimide glass, glass-epoxy, ferrite, etc., of electronic parts, such as high-frequency coils, dielectric filters, capacitors, hybrid-ICs, etc. The electroless plating requires use of an activating catalytic solution to activate the surfaces of the substrate.

An activating catalytic solution is applied on a substrate to form a photo-sensitive film. When the photo-sensitive film formed from an activating catalytic solution is radiated with ultra-violet rays or laser rays, the radiated region of the photo-sensitive film is selectively activated so that only the radiated region can be plated. Therefore, it is possible to form conductive films having fine patterns by using such an activating catalytic solution and photolithographic technology.

Conventionally, palladium acetylacetonate dissolved into an organic solvent such as chloroform has been used as an activating catalytic solution. Such activating catalytic solution using palladium acetylacetonate requires use of a great amount of an organic solvent for cleaning the substrate during the development process. However, it is not preferable to consume that much organic solvent in view of economic and environmental reasons. If not used in excess, the unnecessary portion of the photo-sensitive film formed by the activating catalytic solution is likely to remain on the substrate due to imperfect cleaning. This would causes plating metal to be deposited on such unnecessary portions, which results in poor resolution of metal patterns formed by the following electroless plating.

In order to solve the problem, Japanese Laid-open Patent Application No. 7-33601 discloses a hydrophilic activating catalytic solution including an oxalate such as iron oxalate, a palladium salt such as palladium chlorate and an alkaline solution.

According the Japanese Laid-open Patent Application, the activating catalytic solution is applied on the substrate surface by a spin-coat method or the like to form a photo-sensitive film. The photo-sensitive film is exposed to light such as laser rays, thereby depositing a palladium catalyst on the substrate. The photo-sensitive film may be exposed through a photomask for selective deposit of the palladium catalyst. In this case, unexposed regions of the photo-sensitive film are removed by water or water-based liquid. After dipping the substrate on which palladium catalyst is deposited in the electroless plating bath, an electroless plating film is formed on the substrate with the help of the palladium catalyst as an activating catalyst.

According to this technology, it is unnecessary to use any organic solvent during the development process since the activating catalytic solution is hydrophilic. Therefore, it is possible to eliminate use of organic solvents during the processes from preparation of the activating catalytic solvent to electroless plating. In addition, the unnecessary portion of the photo-sensitive film can be removed using a large amount of water. However, the conventional activating catalytic solution has the following problems.

Specifically, palladium and oxalate in the activating solution form palladium oxalate which has a low solubility in an alkaline solution and it is difficult to improve the solubility. In particular, iron oxalate employed in the Japanese publication has a distinct disadvantage in this regard. This causes a problem that the photo-sensitive film formed by using the catalytic solution has a low sensitivity and results in a low contrast between the exposed portion and unexposed portion. To cope with the problem, it may require a long duration of exposure, which the increases production cost and decreases the deposition efficiency of the plating metal.

Further, when the unnecessary portion of the exposed photo-sensitive film is removed with water, the iron oxalate is hydrolyzed to form hydroxides including the palladium catalyst. The hydroxide is fixed on the substrate and is not removed by water. This means that the unexposed portion of the photo-sensitive film is also activated and that the electroless plating metal is deposited on the unexposed portion, thereby reducing reliability of insulating properties between conductive patterns. This causes the necessity of removing the hydroxide by dipping the substrate in a sodium hydroxide solution of pH 14 or greater or to enlarge the space between the conductive patterns, which increases the manufacturing steps or sacrifices the ability make fine patterns.

In view of the foregoing reasons, there arises a demand for an activating catalytic solution which can solve the above-mentioned problems and enable deposit of a palladium catalyst by short time exposure, as well as removing remained photo-sensitive film effectively by the washing process.

SUMMARY OF THE INVENTION

The present invention is directed to a hydrophilic activating catalytic solution and method for electroless plating that can satisfy this demand. The hydrophilic activating catalytic solution for electroless plating is a mixture of lactate, palladium salt and an alkaline medium. The metal lactate preferably comprises at least one of copper lactate and zinc lactate, and the palladium salt is preferably palladium chloride. The alkaline medium is preferably aqueous ammonia.

The method for electroless plating comprises the steps of: applying the aforementioned hydrophilic activating catalytic solution on a substrate to form a photo-sensitive film on the substrate; exposing the photo-sensitive film to deposit palladium catalyst on the substrate; and electroless plating the substrate using the palladium catalyst as an activating catalyst.

The photo-sensitive film may be selectively exposed so as to form an exposed portion and an unexposed portion of in the photo-sensitive film. It is preferable that the method further comprises, between the exposing step and electroless plating step, the step of removing the unexposed portion of the photo-sensitive film with water or a water-based liquid.

DETAILED DESCRIPTION OF PREFERRED EMBODIMENTS

Hereinafter, the preferred embodiments of the present invention are explained in detail.

The hydrophilic activating catalytic solution according to the present invention for the electroless plating is a mixed solution of lactate, palladium salt and an alkaline medium. Preferably, copper lactate, zinc lactate or the combination thereof is employed as the lactate. In addition, palladium chloride and ammonia water are used as palladium salt and the alkaline medium, respectively.

When the photo-sensitive film prepared from the hydrophilic activating catalytic solution is exposed to light, copper ions or zinc ions originating from the copper lactate or zinc lactate are activated so as to interact with the palladium ions. The palladium ions are then reduced to metallic palladium, thereby depositing catalytic palladium on the substrate.

Although the chemical mechanism of the hydrophilic activating catalytic solution according to the present invention is not fully understood, it is thought to be important that lactate and palladium salt form palladium lactate which is easy to dissolve in the alkaline solution. By using an activating catalytic solution containing the highly soluble palladium lactate, a distinct contrast between the exposed area and non-exposed area can be obtained by a short time exposure to light, in the course of deposition of palladium catalyst on the substrate. Further, because the lactate is not likely to be subjected to hydrolytic decomposition, it becomes possible to remove photo-sensitive film effectively without forming any unnecessary compounds.

It is therefore thought that a preferable feature of the invention is that the hydrophilic activating catalytic solution of the invention is alkaline and comprises palladium ions, lactate ions and at least one of copper ions and zinc ions.

Although it is preferable to use both copper lactate and zinc lactate as the lactate, any other copper salt and zinc salt may be used in place of copper lactate and zinc lactate, respectively.

The electroless plating method according the present invention includes the step of applying the activating catalytic solution according to the invention on a substrate to form a photo-sensitive film made of the activating catalytic solution. Then, the photo-sensitive film is exposed to light such as laser rays, thereby depositing palladium catalyst on the substrate. Next, the substrate with the deposited palladium catalyst is dipped in a electroless plating bath, whereby the electroless plating film is deposited on the substrate due to the catalysis of the palladium catalyst.

When the photo-sensitive film is exposed to ultra-violet rays or scanned by laser rays through a photomask, it is preferable to provide a development step of washing out the unexposed part of the photo-sensitive film with water or a water-based liquid.

In addition, the substrate with the deposited palladium catalyst may be subjected to a heat treatment before the substrate is dipped in an electroless plating bath so as to stabilize the deposited palladium catalyst and enhance an activity of the palladium catalyst. More specifically, it is preferable that the substrate with the deposited palladium catalyst is heated under an inert atmosphere such as a nitrogen gas at the temperature of about 100 to 300° C. The duration of the heat treatment may be changed in accordance with the temperature of the heat treatment, but it is preferable to heat the substrate at about 140 to 180° C. for about 1 to 5 minutes.

By taking advantage of the heat treatment, the present invention may be applied to a simultaneous electroless plating on both sides of a transparent substrate. For example, after depositing a palladium catalyst on a front side of a transparent substrate according to the aforementioned method, the transparent substrate is subjected to heat treatment. Then, the photo-sensitive film is formed on the back side of the transparent substrate and exposed to light according to the aforementioned method. At the time, since the palladium catalyst deposited on the front side is stabilized by the heat treatment, the palladium catalyst deposited on the front side can be successfully prevented from being deactivated by light irradiated on the back side of the transparent substrate. Therefore, electroless plating films can be formed simultaneously on the both side of the transparent substrate by dipping the substrate in a electroless plating bath.

EXAMPLE 1

In order to prepare 10 ml activating catalytic solutions used for samples 1 to 5, zinc lactate ($Zn(C_3H_5O_3)_2 \cdot 3H_2O$), copper lactate ($Cu(C_3H_5O_3)_2$), and palladium chloride ($PdCl_2$) in the amounts mentioned in the following Table 1 were dissolved in 2 ml of ammonia water (28%), diluted with 8 ml of water, and the resulting solution was filtered with a 0.45 μm milli-pore filter.

TABLE 1

| Sample No. | 1 | 2 | 3 | 4 | 5 |
| --- | --- | --- | --- | --- | --- |
| Zinc lactate | 0.10 g | 0.10 g | 0.10 g | 0.10 g | 0.10 g |
| Copper lactate | 0.01 g | 0.02 g | 0.03 g | 0.04 g | 0.05 g |
| Palladium chloride | 0.05 g | 0.05 g | 0.05 g | 0.05 g | 0.05 g |

Next, each activating catalytic solution according to the above samples 1 to 5 was spin-coated on an alumina substrate for 30 seconds at a rotation speed of 1,000 rpm to form a photo-sensitive film. Then, all the films were exposed to ultra-violet rays from an exima-lamp (wave length: 172 nm) at a power of 10 mm W/cm² for 3 seconds, 5 seconds, 10 seconds and 30 seconds, respectively. After water washing, the substrates were dipped into an electroless plating solution (60° C.) of the following composition for 10 minutes to effect electroless plating:

| | |
| --- | --- |
| $NiSO_4 \cdot 6H_2O$ | 30 g |
| Sodium hypophosphite | 10 g |
| Sodium acetate (anhydrous) | 10 g |

Samples 1 to 5 thus obtained were observed to see if deposition of an electroless nickel plating film resulted. The results are shown on Table 2.

TABLE 2

| Sample No. | 1 | 2 | 3 | 4 | 5 |
| --- | --- | --- | --- | --- | --- |
| 3 seconds | No deposit | Deposit | Deposit | No deposit | No deposit |
| 5 seconds | Deposit | Deposit | Deposit | Deposit | No deposit |
| 10 seconds | Deposit | Deposit | Deposit | Deposit | No deposit |
| 30 seconds | Deposit | Deposit | Deposit | Deposit | Deposit |

As shown in Table 2, by using activating catalytic solution containing zinc lactate, copper lactate, palladium chloride and ammonia water, an electroless nickel plating film was deposited in all cases of 30 second ultra-violet radiation. In case of samples 2 and 3, it was possible to obtain deposition of plating film under very short time ultra-violet radiation of only 3 seconds. Where 10 second of ultra-violet radiation was performed using the activating catalytic solution sample 2, it was confirmed that a nickel pattern having resolution grade (line/space) of 25 μm at a film thickness of 0.3 μm on the substrate surface was formed.

Further, based on sample 2 of this experiment and using samples in which palladium chloride amount was varied between 0.1 g to 0.05 g, similar experiments were performed. It was found that even if the amount of palladium chloride was varied, an electroless nickel plating film was deposited.

EXAMPLE 2

In this Example 2, copper chloride ($CuCl_2.2H_2O$) was used in place of copper lactate. Zinc lactate, copper chloride and palladium chloride at the composition ratio mentioned in the following Table 3 were dissolved in 2 ml of ammonia water (28%), diluted by 8 ml water, and filtered with a 0.45 μm milli-pore filter.

TABLE 3

| Sample No. | 6 | 7 | 8 |
|---|---|---|---|
| Zinc lactate | 0.10 g | 0.10 g | 0.10 g |
| Copper chloride | 0.01 g | 0.02 g | 0.03 g |
| Palladium chloride | 0.05 g | 0.05 g | 0.05 g |

Next, each activating catalytic solution according to the above Samples 6 to 8 was, in a similar way to Example 1, spin-coated to form a photo-sensitive film, the films were radiated using the ultra-violet rays as in Example 1 for 10 seconds, 20 seconds and 30 seconds, respectively, water washed, and then were dipped in the electroless plating bath of Example 1 for 10 minutes.

Samples 6 to 8 thus obtained were observed to check if deposition of an electroless nickel plating film had occurred. The result is shown on Table 4.

TABLE 4

| Sample No. | 6 | 7 | 8 |
|---|---|---|---|
| 10 seconds | No deposit | No deposit | No deposit |
| 20 seconds | No deposit | Deposit | No deposit |
| 30 seconds | Deposit | Deposit | Deposit |

As shown in the above Table 4, electroless plating films were deposited on all of Samples 6 to 8 at the radiation time of 30 seconds. Moreover, deposition was confirmed on sample 7 at 20 seconds radiation.

It was also confirmed that copper sulfate instead of copper chloride brings about a similar result.

EXAMPLE 3

Example 1 was followed but in this Example 3, zinc chloride was used in place of zinc lactate. Zinc chloride, copper lactate and palladium chloride in the amounts mentioned in the following Table 5 were dissolved in 2 ml ammonia water (28%), diluted by 8 ml water, and filtered with a 0.45 μm milli-pore filter.

TABLE 5

| Sample No. | 9 | 10 | 11 |
|---|---|---|---|
| Zinc chloride | 0.10 g | 0.10 g | 0.10 g |
| Copper lactate | 0.01 g | 0.02 g | 0.03 g |
| Palladium chloride | 0.05 g | 0.05 g | 0.05 g |

Next, each activating catalytic solution according to Samples 9 to 11 was, in a similar way to Example 1, spin coated to form a photo-sensitive film, radiated by the ultra-violet rays for 10 seconds, 20 seconds and 30 seconds, respectively, unreacted photo-sensitive films were removed by water washing, and the samples were dipped in the electroless plating bath for 10 minutes.

Samples 9 to 11 thus obtained were observed to check if deposition of a nickel electroless plating film resulted. The result is shown on Table 6.

TABLE 6

| Sample No. | 9 | 10 | 11 |
|---|---|---|---|
| 10 seconds | No deposit | No deposit | No deposit |
| 20 seconds | No deposit | No deposit | Deposit |
| 30 seconds | No deposit | Deposit | Deposit |

As shown in Table 6, at 20 seconds of radiation time in case of Sample 11, and at 30 seconds of radiation time in case of Samples 10 and 11, the deposition of plated film was confirmed. In case of Sample 9, when the radiation time of ultra-violet rays was made comparatively long (3 minutes), the deposition of a plated film was confirmed after dipping in the electroless plating bath for 2 to 3 minutes.

As is understood from this example, the deposition of electroless nickel plating film is still possible, even in the case where zinc lactate is not used, by using copper lactate as copper salt and by adjustment of radiation time of the ultra-violet rays. It was also confirmed that zinc sulfate instead of zinc chloride brings about a similar result.

COMPARATIVE EXAMPLE 1

In this comparative Example, which is out of the scope of the present invention, zinc chloride is used in place of zinc lactate of Example 1, and copper chloride ($CuCl_2.2H_2O$) in place of copper lactate of Example 1. Zinc chloride, copper chloride and palladium chloride in the amounts mentioned in Table 7 were dissolved in 2 ml of ammonia water (28%), diluted by 8 ml water, and filtered with a 0.45 μm milli-pore filter.

TABLE 7

| Sample No. | 12 | 13 | 14 |
|---|---|---|---|
| Zinc chloride | 0.10 g | 0.10 g | 0.10 g |
| Copper chloride | 0.01 g | 0.02 g | 0.03 g |
| Palladium chloride | 0.05 g | 0.05 g | 0.05 g |

Next, each activating catalytic solution according to Samples 12 to 14 was, in a similar way to Example 1, spin-coated to form a photo-sensitive film, radiated by ultra-violet rays for 10 seconds, 20 seconds and 30 seconds, respectively, unreacted photo-sensitive films removed by water washing, and then were dipped in the electroless plating bath for 10 minutes.

Samples 12 to 14 thus obtained were observed to check if deposition of an electroless nickel plating film occurred. As a result of the observation, it was confirmed that no nickel plating film was deposited in any of Samples 12 to 14 regardless of the duration of the radiation.

EXAMPLE 5

In Example 1, zinc lactate, copper lactate and palladium chloride were used, but in this Example 5, copper lactate was not added to activating catalytic solution and only zinc lactate was used as the lactate. Thus, zinc lactate and palladium chloride according to the ratio mentioned in Table 8 were dissolved in 2 ml of ammonia water (28%), diluted by 8 ml water, and filtered with a 0.45 μm milli-pore filter.

TABLE 8

| Sample No. | 15 | 16 | 17 | 18 | 19 |
|---|---|---|---|---|---|
| Zinc lactate | 0.05 g | 0.10 g | 0.15 g | 0.20 g | 0.30 g |
| Palladium chloride | 0.05 g | 0.05 g | 0.05 g | 0.05 g | 0.05 g |

Next, each activating catalytic solution according to Samples 15 to 19 was, in a similar way to Example 1, spin-coated to form a photo-sensitive film, the films radiated by the ultra-violet rays for 3 seconds, 5 seconds and 10 seconds, respectively, unreacted photo-sensitive film was removed by water washing, then the samples were dipped in the electroless plating bath for 10 minutes. In place of nickel plating solution as a electroless plating bath, a 1 liter of formalin type electroless copper plating solution (36° C.) of the following components was used:

| | |
|---|---|
| CuSO$_4$ · 5H$_2$O | 70 g |
| EDTA · 4H$_2$O | 100 g |
| NaOH | 60 g |

Samples 15 to 19 thus obtained were observed to check if deposition of a electroless copper plating film occurred. The result is shown in Table 9.

TABLE 9

| Sample No. | 15 | 16 | 17 | 18 | 19 |
|---|---|---|---|---|---|
| 3 seconds | No deposit | No deposit | No deposit | No deposit | Deposit |
| 5 seconds | Deposit | No deposit | Deposit | No deposit | Deposit |
| 10 seconds | Deposit | Deposit | Deposit | Deposit | Deposit |

In all of Samples 15 to 19, a plating film was deposited at a radiation time of 10 seconds. In case of Samples 18 and 19, the deposition of plating films were possible at an ultra-violet ray radiation time as short as 3 seconds. Example 5 confirms that when zinc lactate is used as the lactate, a good electroless plating film was deposited using an electroless copper plating bath. It is also confirmed that when the electroless plating was performed using the activating catalytic solution of Sample 19 with the radiation of ultra-violet rays for 5 seconds, a electroless plating copper pattern having resolution grade (line/space) of 25 μm at the film thickness of 0.3 μm on the substrate was obtained.

EXAMPLE 6

In Example 6, zinc lactate was not added to activating catalytic solution and only copper lactate was used as the lactate. Copper lactate and palladium chloride according to the ratio mentioned in Table 10 were dissolved in 2 ml of ammonia water (28%), diluted by 8 ml water, and filtered with a 0.45 μm milli-pore filter.

TABLE 10

| Sample No. | 20 | 21 | 22 | 23 | 24 |
|---|---|---|---|---|---|
| Copper lactate | 0.05 g | 0.10 g | 0.15 g | 0.20 g | 0.30 g |
| Palladium chloride | 0.05 g | 0.05 g | 0.05 g | 0.05 g | 0.05 g |

Next, each activating catalytic solution according to Samples 20 to 24 was, in a similar way to Example 1, spin coated to form photo-sensitive film, and the films were radiated by the ultra-violet rays for 30 seconds, 60 seconds and 180 seconds, respectively. The unreacted photo-sensitive films were removed by water washing, and the samples dipped in the electroless nickel plating bath for 10 minutes. In Example 6, the electroless plating bath had the same composition as used in Example 1.

Samples 20 to 24 thus obtained were observed to check if deposition of electroless nickel plating film occurs. The result is shown on Table 11.

TABLE 11

| Sample No. | 20 | 21 | 22 | 23 | 24 |
|---|---|---|---|---|---|
| 30 seconds | No deposit | No deposit | No deposit | No deposit | No deposit |
| 60 seconds | Deposit | No deposit | No deposit | No deposit | Deposit |
| 180 seconds | Deposit | Deposit | Deposit | Deposit | Deposit |

As shown in Table 11, deposit was confirmed on Sample 24 at a radiation time of 60 seconds, and on all of the samples at the radiation time of 180 seconds.

It is therefore confirmed that even in the case where only copper lactate is used as the lactate, it was possible to deposit an electroless plating nickel film by adjustment of the radiation time.

EXAMPLE 7

Example 7 is different from Examples 1 to 6 and is intended to confirm the difference in solubility between palladium lactate and palladium oxalate in alkaline solution. Specifically, lactic acid ($C_3H_6O_3$) and oxalic acid ($C_2H_2O_4$), respectively, were dissolved in 2 ml ammonia water (28%) containing 0.1 g palladium chloride and additional water according to the ratio shown in Tables 12 and 13, and the respective solubilities of each palladium lactate and palladium oxalate were checked.

TABLE 12

| Sample No. | 25 | 26 | 27 | 28 | 29 |
|---|---|---|---|---|---|
| Lactic acid | 0.10 g | 0.10 g | 0.10 g | 0.10 g | 0.10 g |
| Ammonia water | 2 ml | 2 ml | 2 ml | 2 ml | 2 ml |
| Palladium chloride | 0.10 g | 0.10 g | 0.10 g | 0.10 g | 0.10 g |
| Water | 0 ml | 2 ml | 4 ml | 5 ml | 6 ml |
| Solubility | Dissolved | Dissolved | Dissolved | Dissolved | Dissolved |

TABLE 13

| Sample No. | 25 | 26 | 27 | 28 | 29 |
|---|---|---|---|---|---|
| Oxalic acid | 0.10 g | 0.10 g | 0.10 g | 0.10 g | 0.10 g |
| Ammonia water | 2 ml | 2 ml | 2 ml | 2 ml | 2 ml |
| Palladium chloride | 0.10 g | 0.10 g | 0.10 g | 0.10 g | 0.10 g |
| Water | 0 ml | 2 ml | 4 ml | 5 ml | 6 ml |
| Solubility | Insoluble | Insoluble | Insoluble | Insoluble | Dissolved |

From the results shown in Tables 12 and 13, it was shown that compositions containing 0.1 g each of lactic acid and palladium chloride are complete solutions when 2 ml of ammonia water (28%) are present. On the other hand, in order to dissolve 0.1 g each of oxalic acid and palladium chloride, at least 2 ml of ammonia water (28%) and also 6 ml of additional water is required. From the result mentioned above, it was shown that the solubility of palladium salt in the same amount of alkaline water is greater in the case of lactate than that in the case of oxalate.

Modifications

Although specific compositions of activating catalytic solution were employed in the above examples, the content of lactate solution (per 10 ml solution) can vary from about 0.01–1 g, preferably about 0.1–0.5 g. More specifically, zinc lactate and copper lactate can be varied in the range of from about 0.01 to 0.5 g (preferably about 0.05–0.2 g) and about 0.003 to 0.5 g (preferably 0.02 to 0.4 g), respectively, per 10 ml of (activating catalytic solution (i.e., total volume). The content of palladium salt can be varied in the range of from about 0.01 g to saturation, preferably about 0.3 to 0.7 g, and the content of ammonia water (28%) can be varied in the range of from about 0.5 to 5 ml. In addition, in place of palladium chloride, other hydrophilic palladium salts, such as palladium sulfate, palladium nitrate, palladium acetate or the like may be used.

In order to apply the activating catalytic solution more uniformly on a substrate, a hydrophilic binder such as polyvinyl alcohol or a surfactant may be added to the activating catalytic solution.

Further, the wavelength of light to be radiated photo-sensitive film may be varied in the range of from about 100 nm to 400 nm. Furthermore, the activating catalytic solution of the present invention may be used for electroless plating of silver, palladium, gold and platinum in addition to nickel and copper.

As the substrate to be electroless plated, not only the above mentioned alumina substrate, but also any other substrate such as dielectric or magnetic ceramic substrate, polyimide substrate, glass substrate, plastic substrate such as glass-epoxy substrate, semiconductor substrate, may be used.

The electroless plating method according to the invention can be performed without a developing by water washing. For example, when the entire region of the photo-sensitive film is exposed, the developing process can be omitted. Moreover, in the case where a fine resolution of plating metal is not required, the developing process may be omitted even if a selective exposure is performed. Further, the developing process may be performed with a water-based liquid instead of water. Other liquids may be also used.

As is clear from the foregoing explanations, by using activating catalytic solution according to this invention, the following effects are achieved.

First, because the activating catalytic solution according to this invention is hydrophilic, merits due to an affinity for water may be enjoyed. That is, the developing process can be performed safely and economically with a large volume of water, which ensures the removal of unnecessary photo-sensitive film to form fine patterns with high resolution.

Since the lactate is used in the composition of the activating catalytic solution is very soluble in alkaline solution, it is easy to obtain the activating catalytic solution having a high concentration of metal. This enables fast deposition of the palladium catalyst on the substrate and permits short exposure to light for depositing palladium catalyst. For example, when radiation at a power of 10 mm W/cm$^2$ is employed using an exima-lamp having the wavelength of 172 nm, the palladium catalyst is deposited by 3 seconds exposure in the optimal example above. Therefore, it is possible to reduce production cost and improve deposition efficiency of electroless plating metal.

In addition, the activating catalytic solution according to this invention will not cause substantial hydrolyzing decomposition. Thus, the unexposed potion of the photo-sensitive film can be removed thereby eliminating an electroless plating metal deposit on the unexposed portion and improving the resolution of the pattern of the electroless plating metal.

Furthermore, the plating film deposited by the electroless plating method using an activating catalytic solution according to this invention has a high adhesion strength to the substrate, as it does not contain unnecessary materials such as iron hydroxide. Accordingly, sufficient adhesive strength can be obtained without performing etching on the substrate beforehand. This makes it possible to form an electroless plating metal with sufficient adhesive strength on a substrate which is difficult to etch.

Furthermore, the electroless plating metal to be deposited has a high electro-conductivity as there is no decomposed compound. Therefore, the electroless plating metal formed by using the activating catalytic solution can be applied to form a conductive pattern for high frequency circuit, which requires high electro-conductivity.

What is claimed is:

1. A hydrophilic activating catalytic solution for electroless plating comprising a mixture of lactate, palladium salt and an alkaline medium.

2. The hydrophilic activating catalytic solution for electroless plating according to claim 1, wherein the lactate concentration is about 0.01 to 1 g per 10 ml.

3. The hydrophilic activating catalytic solution for electroless plating according to claim 2, wherein the palladium salt concentration is at least about 0.01 g per 10 ml.

4. The hydrophilic activating catalytic solution for electroless plating according to claim 3, wherein the lactate concentration is about 0.1 to 0.5 g per 10 ml and the palladium salt concentration is about 0.03 to 0.7 g per 10 ml.

5. The hydrophilic activating catalytic solution for electroless plating according to claim 4, wherein the lactate comprises at least one of copper lactate and zinc lactate.

6. The hydrophilic activating catalytic solution for electroless plating according to claim 5, wherein, when present, the copper lactate concentration is about 0.003 to 0.5 g per 10 ml and the zinc lactate concentration is about 0.01 to 0.5 g per 10 ml.

7. The hydrophilic activating catalytic solution for electroless plating according to claim 6, wherein the palladium salt is palladium chloride.

8. The hydrophilic activating catalytic solution for electroless plating according to claim 7, wherein the alkaline medium is aqueous ammonia.

9. The hydrophilic activating catalytic solution for electroless plating according to claim 8, wherein the solution contains both copper and zinc lactate.

10. The hydrophilic activating catalytic solution for electroless plating according to claim 5, wherein, when present, the copper lactate concentration is about 0.02 to 0.4 g per 10 ml and the zinc lactate concentration is about 0.05 to 0.2 g per 10 ml.

11. The hydrophilic activating catalytic solution for electroless plating according to claim 1, wherein the lactate comprises at least one of copper lactate and zinc lactate.

12. The hydrophilic activating catalytic solution for electroless plating according to claim 11, wherein, when present, the copper lactate concentration is about 0.003 to 0.5 g per 10 ml and the zinc lactate concentration is about 0.01 to 0.5 g per 10 ml.

13. The hydrophilic activating catalytic solution for electroless plating according to claim 1, wherein the solution contains both copper and zinc lactate.

14. A method for electroless plating comprising the steps of:
applying a hydrophilic activating catalytic solution for electroless plating to a substrate to form a photo-sensitive film on the substrate, the hydrophilic activating catalytic solution comprising a mixture of lactate, palladium salt and an alkaline medium;
exposing the photo-sensitive film to radiation to deposit a palladium catalyst on the substrate; and
electroless plating the substrate by using the palladium catalyst as an activating catalyst.

15. The method according to claim 14, wherein the photo-sensitive film is selectively exposed to radiation so as to form an exposed portion and an unexposed portion of the photo-sensitive film.

16. The method according to claim 15, further comprising the step of removing the unexposed portion of the photo-sensitive film by contact with an aqueous liquid prior to electroless plating.

17. The method according to claim 16, further comprising, between the removing step and the electroless plating step, the step of heating the substrate.

18. The method according to claim 17, wherein the substrate is heated at a temperature of about 140 to 180° C.

19. The method according to claim 14, wherein the lactate comprises at least one of copper lactate and zinc lactate.

20. The method according to claim 19, wherein, when present, the copper lactate concentration is about 0.003 to 0.5 g per 10 ml and the zinc lactate concentration is about 0.01 to 0.5 g per 10 ml.

21. The method according to claim 20, wherein the solution contains both copper and zinc lactate.

22. The method according to claim 21, wherein the solution contains palladium chloride and aqueous ammonia.

* * * * *